(12) United States Patent
Maunuksela et al.

(10) Patent No.: US 7,002,417 B2
(45) Date of Patent: Feb. 21, 2006

(54) RC AND SC FILTER COMPENSATION IN A RADIO TRANSCEIVER

(75) Inventors: Jaako Maunuksela, Espoo (FI); Jussi Vepsäläinen, Helsinki (FI); Tuomas Honkanen, Helsinki (FI)

(73) Assignee: Nokia Corporation, Espoo (FI)

( * ) Notice: Subject to any disclaimer, the term of this patent is extended or adjusted under 35 U.S.C. 154(b) by 124 days.

(21) Appl. No.: 10/394,455

(22) Filed: Mar. 21, 2003

(65) Prior Publication Data

US 2004/0183602 A1    Sep. 23, 2004

(51) Int. Cl.
*H03L 7/00* (2006.01)

(52) U.S. Cl. .............................. 331/17; 331/18; 331/25; 327/552; 327/553; 327/554; 327/555; 327/556; 327/557; 327/558; 327/559; 333/172; 333/174

(58) Field of Classification Search ........ 327/552–559; 700/28; 331/17, 18, 25; 333/172, 174
See application file for complete search history.

(56) References Cited

U.S. PATENT DOCUMENTS

| 4,242,649 A | 12/1980 | Washburn, Jr. ............... 332/18 |
| 5,079,520 A | 1/1992 | Rapeli ..................... 331/100 A |
| 5,751,194 A | 5/1998 | Haapanen et al. ............. 331/17 |
| 5,920,556 A | 7/1999 | Jorgensen ................... 370/350 |
| 5,983,081 A | 11/1999 | Lehtinen ...................... 455/76 |
| 6,064,272 A | 5/2000 | Rhee ........................... 331/16 |
| 6,112,125 A * | 8/2000 | Sandusky ..................... 700/28 |
| 6,449,465 B1 * | 9/2002 | Gailus et al. ................ 455/126 |
| 6,748,025 B1 * | 6/2004 | Hickling ...................... 375/316 |
| 2001/0045864 A1 | 11/2001 | Kimppa et al. ............. 327/553 |
| 2003/0090316 A1 * | 5/2003 | Dathe et al. ................. 327/554 |

FOREIGN PATENT DOCUMENTS

EP    0 408 238 A2    3/1990

OTHER PUBLICATIONS

Horn Basic Electronics Theory fourth edition TAB books 1994 p. 336.*
McMahill, D. et al, "A 2.5-Mb/s GFSK 5.0-Mb/s 4 FSK Automatically Calibrated E-Δ Frequency Synthesizer", IEEE Journal of Solid-State Circuits, vol. 37., No 1, pp 18-26, Jan. 2002.

* cited by examiner

*Primary Examiner*—Michael B Shingleton
(74) *Attorney, Agent, or Firm*—Harrington & Smith, LLP

(57) ABSTRACT

Disclosed is apparatus for operating with an RC filter (26, 26A), and a corresponding method. The apparatus includes circuitry (32) for use in measuring an actual value of at least one filter component and a controller (34), coupled to the measurement circuitry, for determining at least one adaptive filter (36, 46) coefficient using the measured actual value to so as to compensate for a deviation of at least one filter component value from an ideal value. Where the filter is embodied as an RC network, the circuitry measures an actual value of both a resistor and a capacitor, and the controller uses the measured actual value of the capacitor when determining the value of a resistor.

7 Claims, 6 Drawing Sheets

$$I = C_{act}\frac{dV_c}{dt} \Leftrightarrow V_c = \int_0^t \frac{I}{C_{act}}dt = \frac{It}{C_{des}k_c} \Leftrightarrow k_c = \frac{It}{V_{ref2}C_{des}}$$ FIG.8A $$V_{ref2} = V_{ref1}\left(1 - e^{-\frac{t}{RC}}\right) \Leftrightarrow R_{act} = \frac{t}{C_{act}\ln\left(\frac{V_{ref1}}{V_{ref1} - V_{ref2}}\right)}$$ FIG.8B $$F_{Pre\_emp}(s) = \frac{1 + sR_1C_1}{(1 + sR_2C_2)(1 + sR_2C_2)}$$ FIG.9A $$F(s) = \frac{1}{1 + sk_rR_1k_cC_1}$$ FIG.9B $$F'_{Pre\_emp}(s) = \frac{1 + sk_rR_1k_cC_1}{(1 + sR_2C_2)(1 + sR_2C_2)}$$ FIG.9C $$F'_{Pre\_emp}(s) = K \cdot \frac{\frac{1}{k_rR_1k_cC_1\omega_p} + s}{\left(\frac{1}{R_2C_2\omega_p} + s\right)\left(\frac{1}{R_2C_2\omega_p} + s\right)}$$ FIG.9D $$s = \frac{(z-1)}{(z+1)(\tan(\omega_p \cdot T/2))}$$ FIG.9E $$F'_{Pre\_emp}(z) = K' \cdot \frac{a_0 + a_1z^{-1} + a_2z^{-3}\ldots}{1_0 + b_1z^{-1} + b_2z^{-3}\ldots}$$ FIG.9F

RC AND SC FILTER COMPENSATION IN A RADIO TRANSCEIVER

TECHNICAL FIELD

These teachings relate generally to wireless communications devices and methods and, more specifically, to circuits for implementing phase locked loops (PLLs), voltage controlled oscillators (VCOs) and to methods for compensating for process and temperature-induced variations in PLL component values. These teachings relate as well to polar transmitter architectures that include a PLL, and to techniques for compensating a PLL for process and temperature-induced variations in PLL component values.

BACKGROUND

A Phase Locked Loop (PLL) circuit is typically used for frequency control. The PLL can be configured as, for example, a modulator, a demodulator, a frequency multiplier, a tracking generator, and as a clock recovery circuit. Each of these applications demands different characteristics, but they all use the same basic PLL circuit architecture.

Referring to FIG. 1, a PLL 1 is an electronic circuit with a voltage-driven or a current-driven oscillator that is constantly adjusted to match the phase of, and thus lock on to, the frequency of an input signal. In addition to stabilizing a particular communications channel (keeping it set to a particular frequency), a PLL can be used to generate a signal, modulate or demodulate a signal, reconstitute a signal with less noise, or multiply or divide a frequency. PLLs are frequently used in wireless communication systems, particularly where signals are carried using frequency modulation (FM) or phase modulation (PM). PLLs can also be used in systems that employ amplitude modulation (AM). PLLs are more commonly used for digital data transmission, but can also be designed for use with analog information. Phase-locked loop devices are more commonly manufactured as integrated circuits (ICs), although discrete circuits are typically used for microwave applications.

A PLL includes a voltage-controlled oscillator (VCO) 2 that is typically tuned using a semiconductor diode known as a varactor. The VCO 2 is initially tuned to a frequency close to the desired receiving or transmitting frequency. A circuit referred to as a phase comparator or as a phase detector 3 causes the VCO 2 to seek and lock onto the desired frequency, based on the output of a crystal-controlled reference oscillator (frequency reference input) and the VCO frequency. This procedure relies on a feedback scheme, wherein a feedback control system controls the phase of the VCO. In a common approach the frequency reference signal is applied to one input of the phase detector 3, and the other input of the phase detector is connected to the output of a divide-by-N counter 4. Normally the frequencies of both input signals will be approximately equal, as the VCO 2 runs at N times the frequency of the reference frequency. The output of the phase detector 3 is a voltage proportional to the phase difference between the two inputs. This signal is applied to a loop filter 5. It is the loop filter 5 that determines the dynamic characteristics of the PLL, as the filtered signal controls the VCO 2 (which operates at a frequency that is N times the input frequency reference). If the frequency of the VCO 2 departs from the selected crystal reference frequency, the phase comparator 3 produces an error voltage that is applied to the varactor of the VCO 2, bringing the VCO 2 back to the reference frequency. The PLL, VCO, reference oscillator, and phase comparator together comprise a frequency synthesizer, and wireless equipment that uses this type of frequency control is said to be "frequency-synthesized".

Since a PLL requires a certain amount of time to lock on the frequency of an incoming signal, the intelligence on the signal (voice, video, or data) can be obtained directly from the waveform of the measured error voltage, which should reflect exactly the modulated information on the signal.

In the PLL-based frequency synthesizer, the VCO 2 produces the output carrier signal at the desired frequency based on the VCO frequency control (Vctrl) signal. In the PLL configuration, this control is achieved by the feedback loop, with the VCO output signal coupled via the feedback loop to the phase detector 3 that compares the VCO signal phase and frequency to that of the fixed-frequency reference (Fin) signal, and produces the frequency control (Vctrl) signal corresponding to the phase difference between the VCO signal and the fixed-accurate frequency signal. This frequency control signal (Vctrl) is filtered by the low pass loop filter 5 and is then applied to the VCO 2. The result is that in the steady state the VCO output signal frequency matches that of the fixed-frequency reference signal (is actually N times Fin for the embodiment shown in FIG. 1).

As was explained above, to set the VCO output frequency the frequency divider 4 is included in the PLL feedback loop between the VCO output and the phase detector to enable division of the frequency of the VCO output signal to a frequency that is a multiple of that of the fixed-frequency reference source (Fin).

In a mobile station, such as a cellular telephone, the VCO output frequency can be used to generate the transmitted signal. A modulated transmitted carrier signal can be generated, for example, by mixing a signal from a separate modulator with the VCO output signal, where the mixing result includes the desired modulation. Alternatively, the VCO 2 itself can be modulated.

In direct open-loop modulation, modulating data is directly applied to the VCO 2, or to an appropriate node in the PLL 1 that enables access to the VCO 2. In direct open-loop PLL modulation the feedback loop is periodically closed and the PLL 1 adjusts the carrier frequency, during times that modulation is not performed. However, the required opening of the PLL feedback loop during modulation limits this technique to only burst mode modulation, as the PLL feedback loop must be periodically closed to enable carrier frequency adjustment.

One technique to overcome the foregoing limitation in burst mode open-loop modulation is to use closed-loop modulation, where the data stream is directly applied to the VCO 2, or to a node in the PLL 1 enabling access to the VCO 2, but without opening the PLL feedback loop. In this case there may be several nodes the where data stream can be applied. These are typically referred to as two point modulation and three point modulation, according to the number of modulating nodes in the PLL system.

However, disadvantages of the closed-loop modulation technique arise when the modulating signal bandwidth is larger than the loop bandwidth of the frequency synthesizer.

There are known techniques to avoid this problem. For example, U.S. Pat. No.: 4,242,649, "Method and Apparatus for Modulating a Phased Locked Loop", Washburn et al., discloses a method where the modulation signal is processed to compensate for the transfer functions of loop components, and the processed signal is summed with the loop signal at a point between the output terminals of the phase detector and the low-pass filter of the loop. The processing of the modulation signal involves a pre-emphasis of the signal to compensate for the transfer functions of the loop circuitry located between the voltage controlled oscillator and the summing junction.

It is also well known to digitally process modulating signals to adjust the modulating signal bandwidth prior to feeding the modulating signal to PLL synthesizer. For example, EP 040823 8 A2, "A Frequency Synthesiser", Johnson, discloses a method for producing continuous phase modulation of a carrier frequency by application of digital modulating signals. Modulating signals are digitally processed, pre-shaped and fed to a variable frequency divider and to a loop node located between the phase detector and the VCO.

Compensating the transfer functions of PLL loop components is known by pre-emphasizing the modulating signal. However, further problems can arise during an integrated circuit (IC) manufacturing process. Due to the analog nature of the PLL loop filter 5, the typical IC component tolerance variations, as well as temperature-related effects, can be very detrimental to assuring uniform operation over a number of devices. Also, in mobile phone applications the analog loop filter approach is relied upon.

One method to solve process variation and temperature variation problems is disclosed in the publication: D. R. McMahill, C. G. Sodini, "A 2.5-Mb/s GFSK 5.0-Mb/s 4-FSK automatically calibrated sigma-delta frequency synthesizer", IEEE Journal of Solid-State Circuits, pps. 18–26, January 2002. The basic idea behind the approach of McMahill et al. is that an automatic calibration circuit uses the transmit data to determine an ideal RF output phase trajectory. The actual output phase trajectory is monitored and the PLL is tuned to produce the desired response. By tuning the PLL response to match the inverse of the pre-compensation filter, an efficient fixed coefficient digital filter for a Gaussian filter is provided, and pre-compensation may be used. The loop filter transfer function is adjusted according to component variations.

Also of general interest to the teachings of this invention is U.S. Pat. No.: 6,064,272, "Phase Interpolated Fractional-N Frequency Synthesizer with On-Chip Tuning", W. Rhee, as well as the following commonly assigned U.S. Pat. No.: 5,079,520, "Interpolating Phase-Locked Loop Frequency Synthesizer", J. Rapeli; U.S. Pat. No. 5,751,194, "Phase-Locked Loop Having Charge Pump Controlled According to Temperature and Frequency", M. Haapanen et al.; U.S. Pat. No. 5,920,556, "Frequency Modulation Using a Phase-Locked Loop", K. Jorgensen; and U.S. Pat. No. 5,983,081, "Method for Generating Frequencies in a Direct Conversion Transceiver of a Dual Band Radio Communication System, A Direct Conversion Transceiver of a Dual Band Radio Communication System and the Use of This Method and Apparatus in a Mobile Station", K. Lehtinen. Reference may also be had to commonly assigned U.S. Patent Application Publication No.: US 2001/0045864 A1, Nov. 29, 2001, "Method and Arrangement for Calibrating an Active Filter", Kimppa et al.

The foregoing problems exist as well in a polar transmitter, wherein the signal is divided into phase and amplitude components, as opposed to the traditional division of the signal into in-phase and quadrature (I and Q) components.

What would be desirable to provide is a new and improved compensation technique that is better suited for mobile station applications than the prior art component value and temperature variation compensation techniques. Prior to this invention this need was not adequately addressed.

SUMMARY OF THE PREFERRED EMBODIMENTS

The foregoing and other problems are overcome, and other advantages are realized, in accordance with the presently preferred embodiments of these teachings.

This invention provides a compensation technique that is better suited for mobile station applications. In this invention variations in resistive R and capacitive C circuit elements are measured on an integrated circuit, coefficients for an adaptive digital pre-emphasis filter are calculated and the pre-emphasis filter is adjusted to compensate for process and temperature variations. This technique is especially advantageous, as signal processing circuits, timers and so forth, which are present in the mobile station and used for other purposes, can be re-used and shared with the PLL compensation circuit of this invention.

This invention also provides a high efficiency polar transmitter, where in the polar transmitter the signal is divided into a phase path and an amplitude path. This invention relates most specifically to the phase path, and enables one to achieve stable phase modulation with a low total power consumption. Even further efficiencies are realized when this invention is used in conjunction with a SMPA (Switch Mode Power Amplifier) transmitter circuit.

While this invention is particularly useful in a burst-type of transmitter, such as one intended for GSM/EDGE applications, this invention can also be employed with continuously active transmitters, such as those used in wideband code division, multiple access (WCDMA) applications.

This invention provides for compensating the variations of a loop filter using a number of methods, including: (a) measuring process variations of R and C filter elements using an on-chip current source, timer and a plurality of switches; (b) calculating coefficients for an adaptive digital pre-emphasis filter in a polar transmitter; (c) calculating coefficients for an adaptive channel filter in a general radio receiver; and (d) even more generally, calculating coefficients for an adaptive digital filter in any system that suffers from process and temperature variations.

Disclosed is apparatus for operating with an RC filter, as well as a corresponding method. The apparatus includes circuitry for use in measuring an actual value of at least one filter component and a controller, coupled to the measurement circuitry, for determining at least one adaptive filter coefficient using the measured actual value to so as to compensate for a deviation of at least one filter component value from an ideal value. Where the filter includes an RC network, the circuitry measures an actual value of both a resistor and a capacitor, and the controller uses the measured actual value of the capacitor when determining the value of a resistor.

In a preferred embodiment the measuring circuitry includes a circuitry for determining a first amount of time required to charge a capacitor from a constant current source from an initial voltage to a threshold voltage, and the controller determines the actual value of the capacitor using the first amount of time. The measurement circuitry also includes circuitry for determining a second amount of time required to charge the capacitor from the initial voltage to the threshold voltage using a predetermined voltage applied through a resistor; and the controller determines the actual value of the resistor using the second amount of time and the determined actual value of the capacitor.

In one illustrative and non-limiting embodiment the filter forms a loop filter of a PLL, and an external signal through the adaptive filter controls a feedback path of the PLL. The PLL may form a part of a polar transmitter of a mobile station.

In another illustrative and non-limiting embodiment the filter forms a receive filter of a mobile station, and the adaptive filter is coupled downstream from the receive filter.

In another illustrative and non-limiting embodiment the filter forms a switched capacitor (SC) network, and the measurement circuitry measures an actual value of a capacitor.

The apparatus operates during at least one of: at a turn-on time of the apparatus, during a factory calibration procedure, at a periodic rate, during a change in operating conditions including a change in an RF transmitter channel, a change in an RF transmitter level or a change in an RF receiver gain, and when the controller detects a change in operating temperature.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 5A shows the case where the response is dominated by a digital filter, and FIG. 5B shows the case where both an analog and a digital filter contribute significantly to the total response of the system;

FIGS. 8A and 8B show two mathematical expressions evaluated by the controller of FIGS. 2 and 4 for determining capacitance and resistance values, respectively, for the analog RC filter; and FIGS. 9A–9F are mathematical expressions used in a z-transformation method for calculating pre-emphasis filter coefficients.

DETAILED DESCRIPTION OF THE PREFERRED EMBODIMENTS

Figure 1:
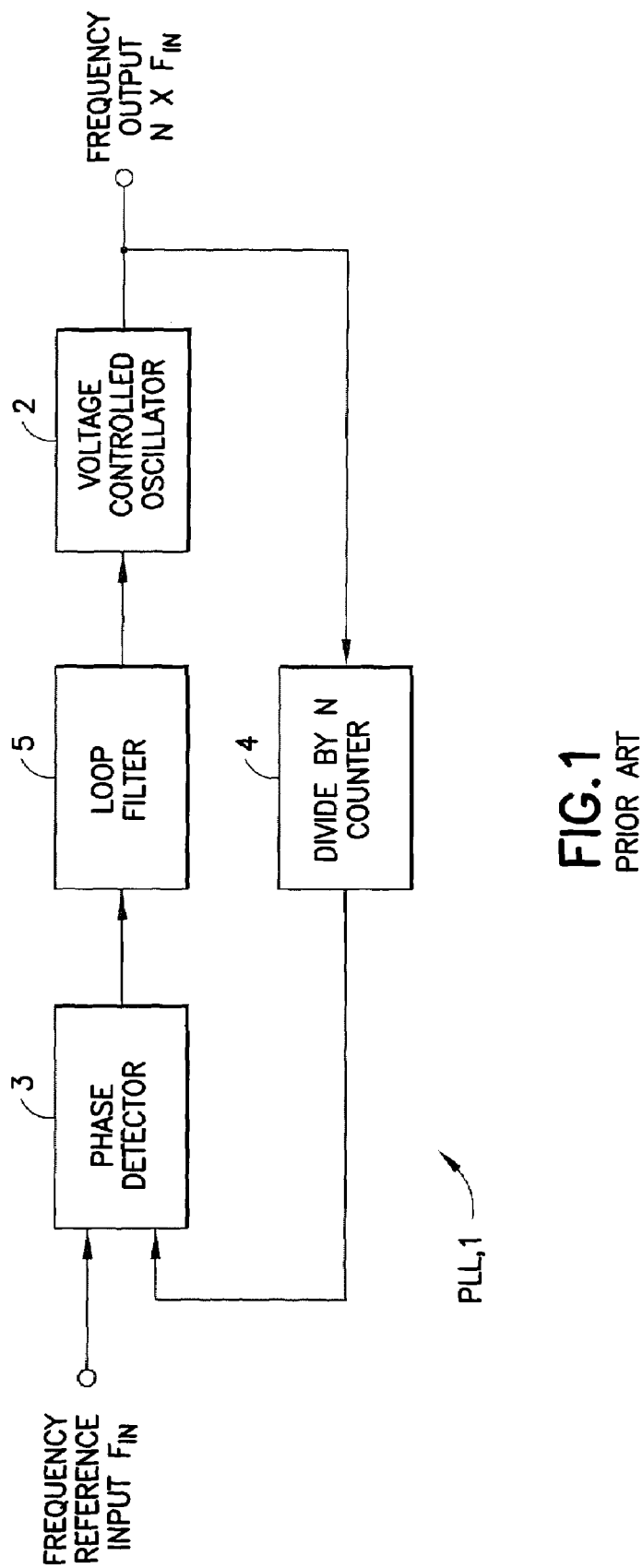
FIG. 1 is a simplified block diagram of a prior art PLL having a VCO, a phase comparator, a loop filter, and a feedback loop implemented with a divide by N circuit.
Figure 2:
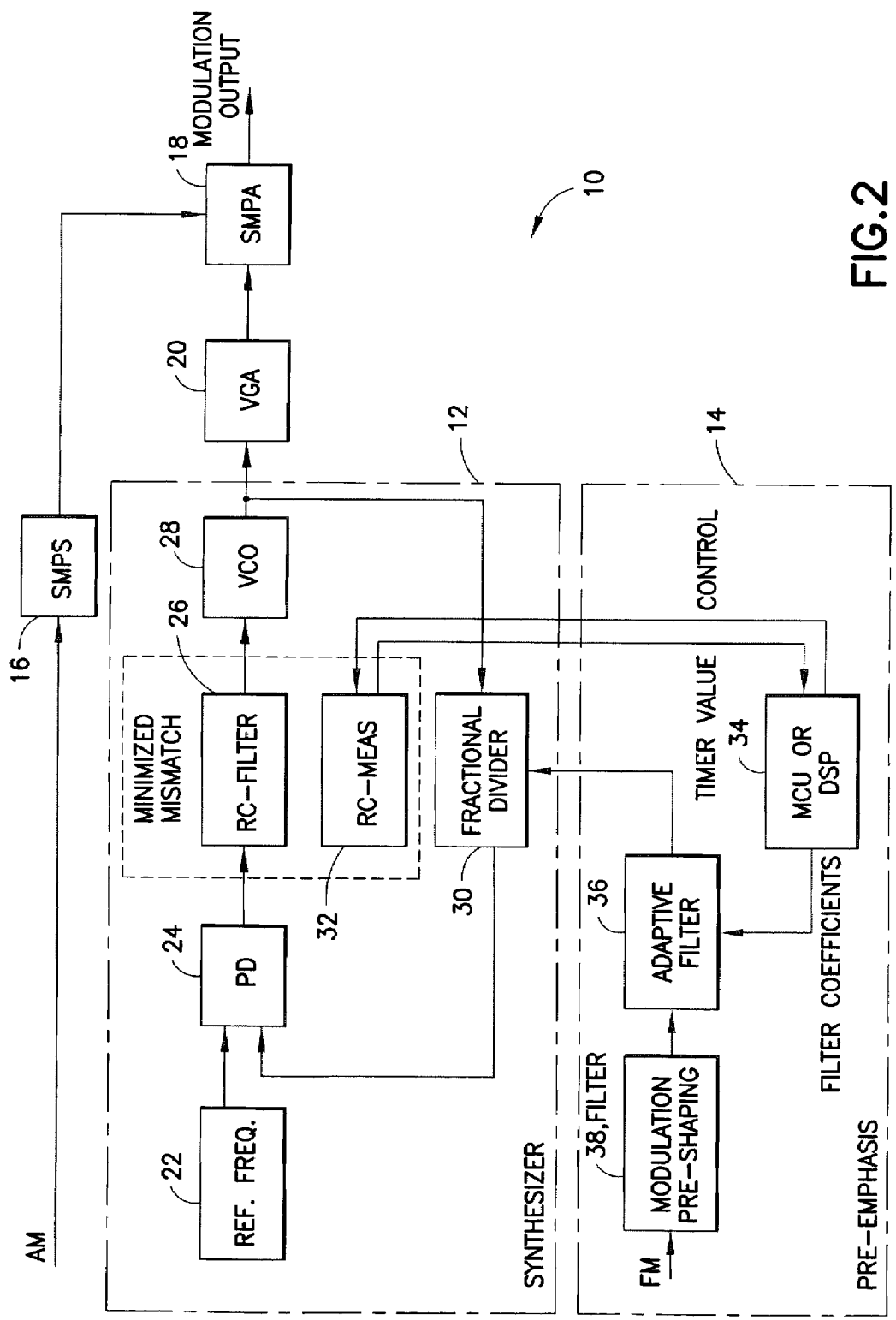
FIG. 2 is a block diagram of circuitry for providing phase modulation in a polar transmitter.

FIG. 2 shows a technique for phase modulation in a polar transmitter 10. The polar transmitter 10 includes a PLL or synthesizer 12, a pre-emphasis block 14, and an amplitude modulating (AM) signal that is applied, via a switch mode power supply (SMPS) 16 to a switch mode power amplifier (SMPA) 18. The input to the SMPA 18 is the output of the synthesizer 12, as applied through a variable gain amplifier (VGA) 20. The gain of the phase modulated signal can be adjusted using the VGA 20. Note that the AM modulation for the polar transmitter 10 can be generated by modulating the output level of the SMPS 16 to the SMPA 18. Note as well that for a GSM embodiment, without EDGE, the amplitude modulation component is not needed, but that the SMPS 16 can be used to vary the output power levels of the SMPA 18.

The synthesizer 12 includes a reference frequency source 22, such as a crystal oscillator, a phase detector 24, an analog loop filter constructed from an RC loop filter 26, also referred to herein as an analog loop filter 26, a VCO 28, and a feedback path from the output of the VCO 28 to the input of the phase detector 24 through a fractional divider 30. In accordance with this invention there is provided an RC measurement block 32 coupled to the RC loop filter 26, and bidirectionally coupled with control and timer values signals to a controller 34, such as a DSP or a MCU. The controller 34 is coupled to an adaptive filter 36 of the pre-emphasis block 14 and provided filter coefficients thereto based on the timer value input received from the RC measurement block 32. As will be described in further detail below, the timer value is in turn based on measured RC component values in the RC loop filter 26, and thus the filter coefficients sent to the adaptive filter 36 are computed to pre-emphasize for variations in the component values due at least to IC process and temperature effects. The input to the adaptive filter 36 is a frequency modulation (FM) signal applied through a modulation pre-shaping filter 38. The modulation pre-shaping filter 38 is selected as appropriate for the modulation format. For example, a Gaussian filter is preferred when using GMSK modulation. Note that the FM input functions as a Phase Modulation (PM) input, as the VCO 28 functions as an integrator and a frequency modulation input is converted to a phase modulation in the VCO output.

An exemplary corner frequency for the RC loop filter 26, in the PLL embodiment, is about 100 kHz.

The polar transmitter 10 uses the fractional-N frequency synthesizer 12. In a fractional-N synthesizer the output frequency can be altered by changing the divider ratio in the feedback loop. If the fractional divider 30 divider ratio is changed at a rate consistent with the changes in the modulating signal, then a phase modulated signal results at the output of the VCO 28. In this technique a complication arises when the modulating signal bandwidth is greater than the loop bandwidth of the synthesizer 12, but this complication can be overcome by pre-emphasizing the modulation signal with the synthesizer's inverse frequency transfer function. However, the problem addressed by this invention relates to the fact that the response of the analog loop filter 26 can vary significantly according to process and temperature variations. The effect of these variations is that the actual values of the resistors and capacitors change. If the pre-emphasis characteristic of the modulating signal is not changed in accordance with the process and temperature variations that occur in the analog loop filter 26, then a significant degradation can occur in the modulated signal that is applied to the SMPA 18.

The pre-emphasis characteristics can be changed using the adaptive filter 36 at the input to the fractional-N divider 30. This invention provides a technique, implemented with the RC measurement block 32 and the controller 34, for measuring the variations in the components of the analog loop filter 26, and for calculating the coefficients of the adaptive filter 36 accordingly so that the pre-emphasis function operates to compensate for the changes in the values of the analog loop filter 26 components.

Figure 3:
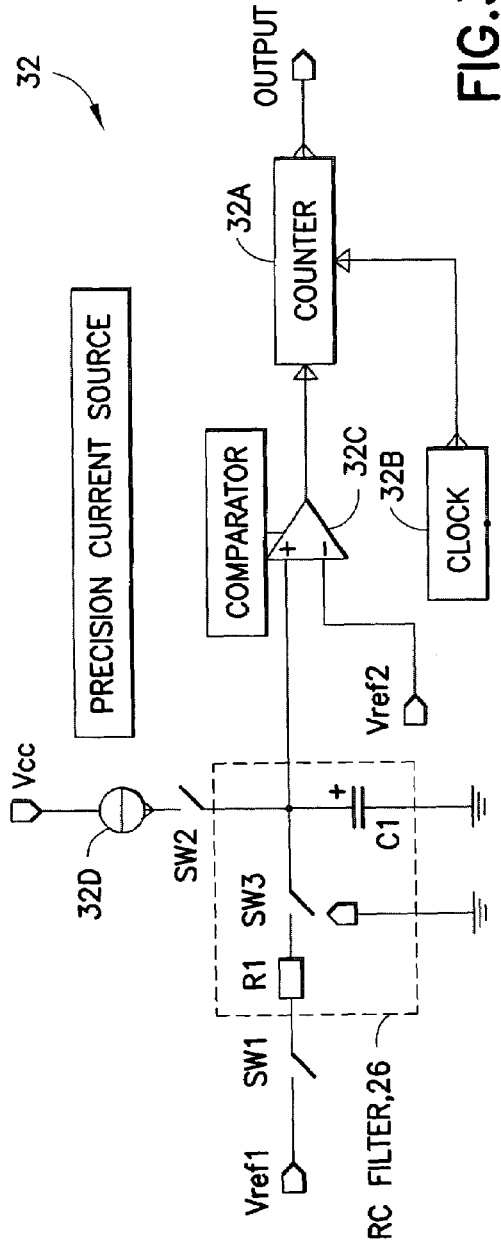
FIG. 3 is block diagram, partly in schematic diagram form, of an RC-filter measurement block.

FIG. 3 shows the construction of the RC loop filter 26 measurement block 32. In FIG. 3 R1 and C1 are assumed to be a part of the RC loop filter block 26, while the remaining components are assumed to form a part of the RC measurement block 32. Note that R1 and C1 may be the actual RC components of the RC loop filter 26, or they may be components that are provided specifically for measurement purposes, and which are provided to serve as surrogates for the actual RC filter components. The former case has the advantage of greater accuracy by measuring the actual RC filter components, but has the drawback that such measurements are restricted from occurring when the RC filter components are actually in use. The latter case has the advantage that measurements can be made at any time, and so long as the process variations are the same for both sets of components, and assuming that the measurement RC components are thermally coupled to and experience the same thermal changes as the actual RC filter components, may be presently preferred for use.

A counter 32A is arranged to count clock cycles from a clock signal generator 32B, in cooperation with a voltage comparator 32C, in order to measure an amount of time that is required to charge C1 from some initial voltage, such as zero volts, to a voltage Vref2. The capacitor measurement is accomplished by charging C1 from a current source 32D with SW1 open and SW2 closed. When the voltage across C1 equals Vref2 the output of comparator 32C changes state, thereby holding the count in counter 32A. An interrupt to controller 34 may be generated at this time so that the controller 34 can read the value stored in counter 32A. The resistor (R1) measurement is accomplished through the RC network by charging C1 through R1 using Vref1, with SW1 closed and SW2 open. As in the capacitor measurement, counter 32A counts the reference clock signal until the comparator 32C senses that the voltage across C1 is equal to Vref2. Note that the value of Vref2 may be changed between the capacitance and the resistance measurements if desired, in particular if Vref2 is generated by a programmable voltage source, such as a digital-to-analog converter (DAC).

The switch SW3 in FIG. 3 is provided for discharging C1 before and between measurements. During the discharging operation of C1 through SW3 to ground it is preferred that both SW1 and SW2 are open.

During the measurement of C1, SW2 and SW3 are closed (SW3 is disconnected from ground), and SW1 is open. During the measurement of R1 SW1 and SW3 are closed, and SW2 is open. Since the value of Vref1 is greater than Vref2, then the R1C1 time constant can be measured.

In a switched capacitor (SC) filter embodiment, the measurement can be accomplished by eliminating Vref1, SW1 and R1, and thereby measuring only the value of C1 using the remaining components and signals (e.g., SW2, SW3, 32D, 32C, Vref2, 32B and 32A).

In any event, having determined the current value of R1 and C1 (for the RC filter embodiment), the controller 34 is enabled to compute appropriate filter coefficients for the adaptive pre-emphasis filter 36 at the input to the fractional-N divider 30.

Figure 4:
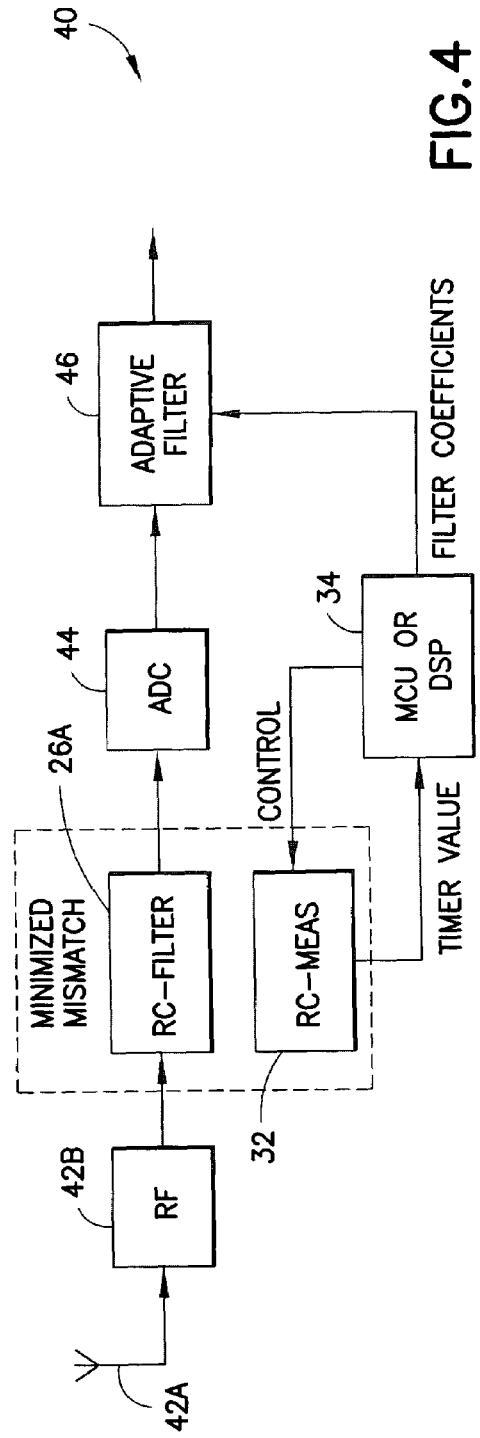
FIG. 4 is a block diagram of circuitry for digitally compensating for RC-variation in the analog filter of the receiver.

FIG. 4 shows an embodiment for digitally compensating the RC-variation in an analog filter 26A of a receiver 40. The construction of the RC measurement block 32 can be identical to the one shown in FIGS. 2 and 3, and in fact it can be the same block if suitable switching components are employed to couple it either to the transmitter RC filter 26 or to the receiver RC filter 26A. In FIG. 4 a receive antenna 42A provides a received signal to a receiver front-end 42B. The received signal is filtered by the analog RC filter 26A and the output is converted to a digital signal by an analog-to-digital converter (ADC) 44. The digital output of the ADC 44 is then applied to a downstream (from the receive filter 26A) digital adaptive filter 46 having filter coefficients that are computed by the controller 34 based on the measured RC values of the filter 26A. In this case the invention enables the controller 34 to bring the cutoff frequency of the analog RC filter 26A closer to the cutoff frequency of the digital filter 46, i.e., it enables the controller 34 to convolve the analog and digital filters without suffering from process and/or temperature component value variations.

Figure 5A:
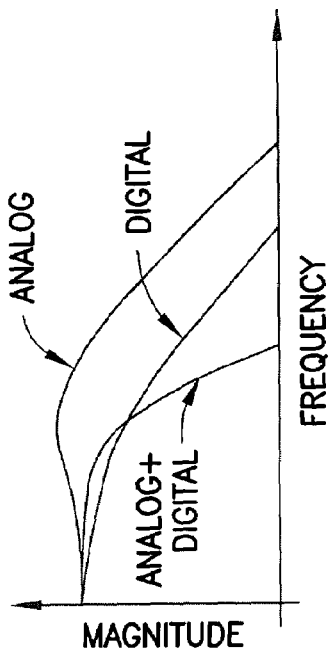
FIGS. 5A and 5B are graphs that depict the response magnitude versus frequency, where
Figure 5B:
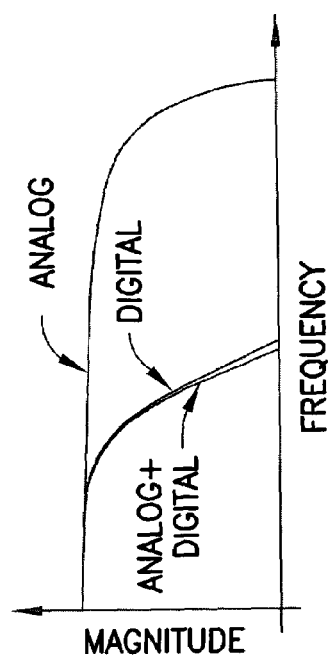

FIGS. 5A and 5B are graphs that depict the magnitude response versus frequency. In FIG. 5A the response is dominated by a digital filter, and the analog filter variation does not contribute significantly to the total response in the pass-band. FIG. 5B shows the case where both the analog and the digital filter contribute significantly to the total response of the system. It should be apparent that the two filters should be closely matched in the embodiment shown in FIG. 5B.

Figure 6:
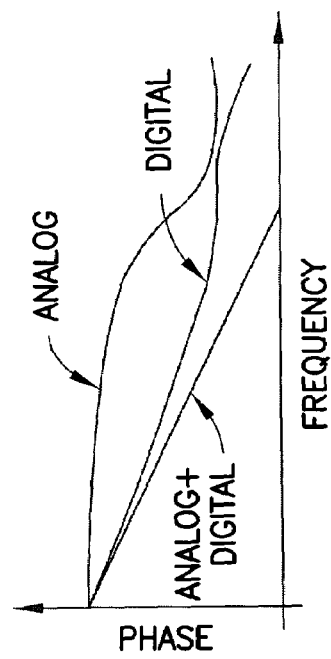
FIG. 6 is a graph that illustrates the phase response of a system having digital phase compensation, where a digital filter is used to linearize the phase response in the pass-band.

FIG. 6 is a graph that illustrates the phase response versus frequency of a system having digital phase compensation, where a digital filter is used to linearize the phase response in the pass-band.

Figure 7:
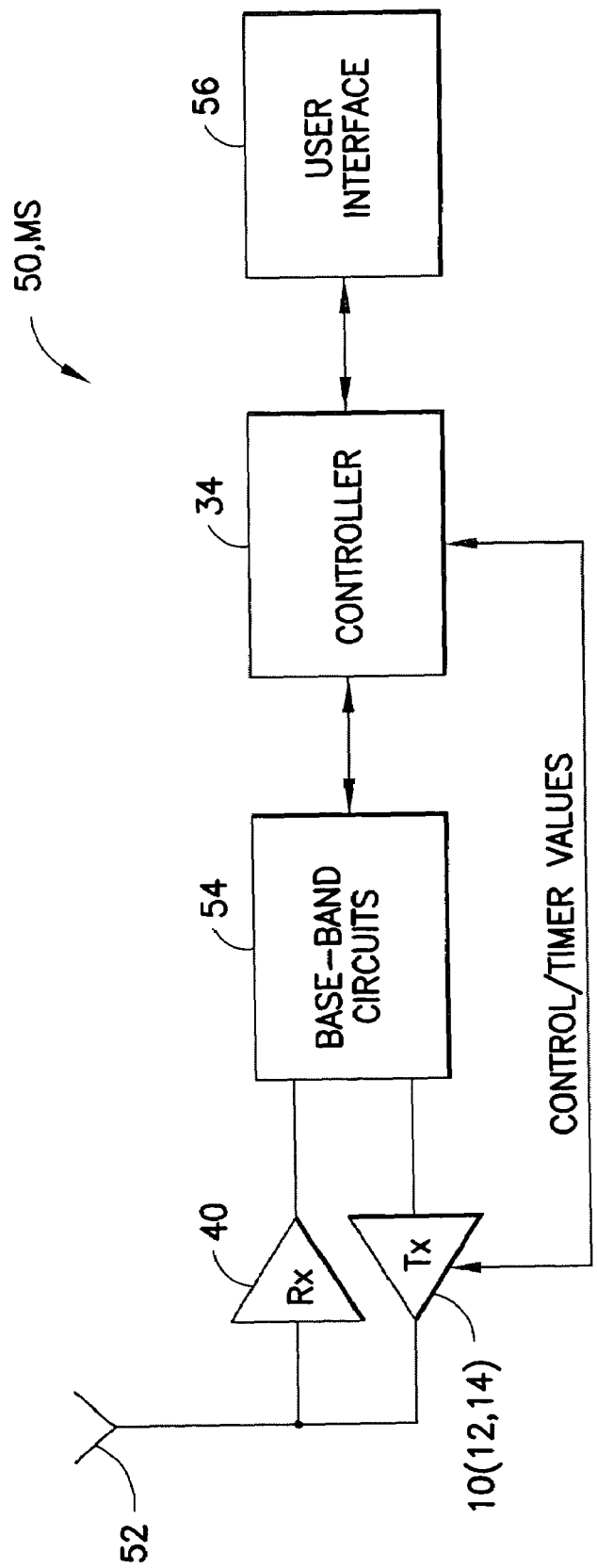
FIG. 7 is a simplified block diagram of a mobile station that is constructed and operated in accordance with this invention.

FIG. 7 is a block diagram of a mobile station (MS) 50, such as a cellular telephone, that is constructed and operated in accordance with this invention. In this embodiment the MS 50 is assumed to include the polar transmitter 10, that includes the blocks 12 and 14 of FIG. 2, as well as the receiver 40 shown in FIG. 4. However, these are shown as examples, as the MS 50 is not constrained as requiring either a polar transmitter or the receiver embodiment shown in FIG. 4. The transmitter 10 and receiver 40 are shown connected to an antenna (or antennas) 52, and to also be connected to appropriate digital baseband circuits 34. The controller 34, such as a MCU or DSP, is connected to the baseband circuits as well as to a user interface 56, such as a keypad and LCD display, as well as a microphone and speaker for a MS 50 that supports voice calls. The control output and timer values input is shown connected between the controller 34 and the synthesizer 12 and the pre-emphasis block 14 of the transmitter 10, just as is illustrated in FIG. 2. Not shown in FIG. 7 is the optional corresponding connections to the receiver 40, as shown in FIG. 4.

Having thus provided an overview of this invention, a more detailed description of same is now provided.

Assume that the analog loop filter 26 is implemented using passive resistor(s) (e.g., R1, R2, . . . ) and capacitor(s) (e.g., C1, C2, . . . ) elements. In practice, the values of these elements are not exactly as specified when the circuit is designed, and will deviate from the ideal (design) value as a function of the constant process variation and the variable temperature variation. However, the actual values of these resistive and capacitive elements can be determined if the IC process and temperature dependent k-factors ($k_R$, $k_C$) are known.

The relation between the ideal (design) value and the actual value for a resistor is given by:

$$R_{N,act} = R_{N,des} * k_R$$

and for a capacitor:

$$C_{N,act} = C_{N,des} * k_C.$$

The two previous equations are based on an assumption that the layout of the components is made in such a manner that mismatch between on-chip components is minimized (e.g., a common-centroid exists).

In accordance with an aspect of this invention, the k-factors can be determined by using the measurement network presented in FIG. 3.

When charged from the constant current source 32D the capacitor voltage $V_C$ increases at a constant rate. The $k_C$ calculation is as shown in the Equation of FIG. 8A. By measuring the time required for the constant current I to result in Vref2 appearing across C1 makes it possible to calculate the actual value of the capacitor C1, and to thereby determine the value of $k_C$. In FIG. 3 this is done by closing SW2 and opening SW1. The time measurement is performed by calculating clock cycles, where the timer (counter 32A) is started when SW2 is closed and stopped when $V_c$ exceeds Vref2 (i.e., when comparator 32C changes state).

After the actual value of the capacitor C1 is known it then becomes possible to determine the actual value of the resistor R1 by measuring the time that it takes to charge C1 from the initial potential (e.g., zero volts) to Vref2 with Vref1 through resistor R1. The $k_R$ calculation is as shown in the Equation of FIG. 8B, where having found $R_{act}$, solving $R_{act}/R_{des}$ yields $k_R$. In this measurement SW2 is opened, and the timer is started when SW1 is closed and the timer stops when $V_c$ exceeds Vref2.

The accuracy of both measured figures, $k_C$ and $k_R$, is linearly dependent on the accuracy of the reference current generated by current source 32D and the clock signal output by the clock generator 32B.

After both k-factors are obtained it becomes possible to calculate the frequency response of the analog RC filter 26, and to then calculate the required response of the adaptive digital filter 36. The coefficient values of the adaptive filter 36 are functions of the actual (act) R and C values in the RC filter 26. When the designed R and C values, and the k-factors, are known, it becomes possible to calculate explicit result for the coefficients applied to the digital adaptive filter 36 from the controller 34. This applied as well o the receiver embodiment of FIG. 4.

In order to reduce computational loading it may be desirable to define a 2-dimensional look-up-table (LUT) for each filter coefficient, where one dimension is $k_R$ and the other is $k_C$. After $k_R$ and $k_C$ are determined, it becomes an easy task to retrieve from the LUT(s) the predefined value for the adaptive filter 36 coefficients.

Examples are now provided of how suitable component values and other parameters may be selected.

In the following it is assumed that Vref1/Vref2=(1−1/e). This approach, by definition, allows one to use the measured time in the RC measurement directly as the RC time constant. Example component values and system parameters are calculated for two cases. First the capacitor C1 is considered to be a separate, additional component that should consume a minimal amount of chip area. In a second case the relatively large capacitor of a loop filter is itself used, a typical value of 2 nF is assumed.

| CASE 1 - Separate C1 | |
|---|---|
| C1 | 100 pF |
| R1 | 10 kohm |
| fclk | 100 MHz |
| Ncounter | 8 bits |
| Icharge | 50 uA |
| Vref2 | 1.0 V |

In this case, the nominal charging time for the capacitor C1 is two microseconds, corresponding to a value of 200 for the counter 32A. Theoretically, a counter output of 201 would imply a capacitance deviation of +0.5%, etc. The nominal time constant is one microsecond, equaling a counter 32A output of 100, which gives a 1% deviation per step.

| CASE 2 - C1 a part of the loop filter | |
|---|---|
| C1 | 2.0 nF |
| R1 | 5 kohm |
| Fclk | 20 MHz |
| Ncounter | 8 bits |
| Icharge | 200 uA |
| Vref2 | 1.0 V |

In this case both the capacitor charging time and the RC time constant are the same: 10 microseconds (due to the large value of C1). This approach enables one to use a lower clock frequency and yet still obtain a nominal counter 32A output of 200.

It should be appreciated that this invention overcomes the problems of temperature and process variations in resistor and capacitor elements in analog or mixed signal ICs, and in the polar transmitter 10 or the general receiver 40. This problem of temperature and process variations is particularly an issue when the analog filtering has a significant effect of the total response of the system, as was shown above in the example of FIG. 5B.

This use of this invention provides an enhancement to the polar transmitter architecture, which has improved performance and lower power consumption than conventional transmitters, and which may operate with a class-E power amplifier 18, as compared to a conventional transmitter that requires a class-A or class-AB power amplifier.

Advantages that are realized by the use of this invention include, but need not be limited to: an on-chip calibration of process and temperature variations to compensate variations of the loop filter 26, the enabling of a power efficient transmitter architecture; no off-chip components are required if the precision of the current source 32D is sufficiently high; a low filter 26 update rate, e.g., only once per minute, depending on how fast temperature changes can occur; the time measurement is more area and power efficient method than the use of, for example a voltage measurement, as no ADC is needed; different control implementation options are possible (e.g., explicit calculation versus LUT); large process variations can be tolerated, thereby improving IC yield; the pre-emphasis function can be implemented with either DSP software or a separate hardware block, or a combination of each; and calibration becomes possible during a voice or a data call, if the measured components (R1, C1) are not part of the actively used components of the filter 26.

The calibration procedure can be executed during startup (power-on) of the MS 50, and/or as part of a manufacturing test procedure. During startup or manufacturing test the process variations can be compensated by executing the calibration process at a nominal temperature. Alternatively, in the factory calibration the calibration procedure can be run at various points over a range of temperatures. If the calibration is done during the manufacturing test procedure the determined coefficients for the adaptive filter 36 can be stored as default values into a non-volatile memory (e.g., FLASH RAM, battery-backed RAM, or ROM) of the MS 50. The calibration can also be accomplished when changing transmitter channels. If used for the compensation of the receiver filter 26A the calibration may be performed when the receiver gain changes.

Calibration during a call is also possible, if the R and C in the measurement circuit 32 are not a part of the analog filter, and if their mismatch to the actual components of the RC filter 26 is minimized, as can be accommodated using known methods when designing the layout of the filter 26 and measurement circuit 32. The calibration period depends on how quickly the temperature changes can occur. It is possible to execute the calibration process every time the gain of the power amplifier 18 is changed, which has an effect on the temperature of the MS 50.

In one embodiment the calibration period may be executed periodically, e.g., once per minute, while the MS 50 is on, or while the MS 50 is involved in a call, if the calibration procedure is not executed for some other reason (e.g., a change in transmitter power or channel). An input may also be provided to the controller 34 for indicating a temperature in or associated with the MS 50, such as battery temperature, and the calibration period is adjusted according the temperature-related input.

The equations for the coefficients of the adaptive filter 36 can be constructed so that they are only a function of the R and C values, and on both k-values. The update period depends on how quickly the temperature changes. The process variations are constant, but typically vary between ICs or between IC lots.

Disclosed now are two exemplary and non-limiting methods to calculate the pre-emphasis filter 36 coefficients. By way of introduction, a simplified example is presented where the pre-emphasis function is used to extend the bandwidth of the system.

The transfer function of the system is assumed to be:

$$F(s)=1/(1+sR_1C_1).$$

Bandwidth extension is provided when the incoming signal is pre-emphasized with the inverse transfer function. The poles of the pre-emphasis function are set to the desired corner frequency defined by $R_2C_2$, as shown in the mathematical expression of FIG. 9A, where $s=j\omega$.

When a change in the component parameters are detected the original transfer function is changed to the form shown in FIG. 9B. As a result, the original corner frequency is moved by the factor of $(k_rk_c)/\omega p$, where $\omega_p$ is the corner frequency of the original system. The desired pre-emphasis function then has the form shown in FIG. 9C.

Method 1:

The digital filter coefficients can be obtained from an s-domain transfer function by performing a z-transformation. The z-transformation can be done in several ways. One of the techniques employs a bilinear transformation. The pre-emphasis function is first normalized in the manner shown in FIG. 9D, and s is substituted as shown in FIG. 9E, where T is the digital system sample time. The term $(\tan(\omega_p \times T/2))$ is a pre-warping factor that is used to compensate for the nonlinear z-transform operation. From the z-domain function, and by example, IIR-filter coefficients are directly available as the a and b-terms shown in FIG. 9F.

It should be noted that bilinear transformation is only one suitable method. An example of another is the impulse invariant method.

Method 2:

In this method look-up tables are used in defining filter coefficients. After $k_c$ and $k_r$ are calculated they can be used to address new values of the filter coefficients from the look-up table. The values stored in the look-up table can be calculated using the z-transformation method discussed above, or they can be defined experimentally by measurements.

The use of this invention can be generalized so as to apply to other cases where the variation of IC process and temperature need to be compensated to obtain a desired phase or amplitude response in the system. An example of such system is a mobile phone receiver that has an analog RC-filter and a digital filter after the ADC, as was shown in FIG. 4. In addition to RC-filters, this invention can be applied as well to switched capacitor (SC) filters, the response of which is dependent on capacitance value(s).

While disclosed herein in the context of presently preferred embodiments of this invention, those having skill in the art should appreciate that changes in detail and form may be made to these embodiments, and that equivalent methods and apparatus may be employed, and that all such changes, modifications and equivalents will still fall within the scope of this invention.

What is claimed is:

1. A method to operate a mobile station, comprising:
   measuring an actual value of at least one filter component value; and
   determining at least one downstream adaptive filter coefficient using the measured actual value to so as to compensate the mobile station for a deviation of at least one filter component value from an ideal value,
   where the filter comprises an RC network, and where measuring measures an actual value of a capacitor, and then uses the measured actual value of the capacitor when measuring the value of a resistor.

2. A method to operate a mobile station, comprising:
   measuring an actual value of at least one filter component value; and
   determining at least one downstream adaptive filter coefficient using the measured actual value to so as to compensate the mobile station for a deviation of at least one filter component value from an ideal value, where the filter comprises an RC network, and where measuring comprises:
   determining a first amount of time required to charge a capacitor from a constant current source from an initial voltage to a threshold voltage;
   determining the actual value of the capacitor using the first amount of time;
   determining a second amount of time required to charge the capacitor from the initial voltage to the threshold voltage using a predetermined voltage applied through a resistor; and
   determining the actual value of the resistor using the second amount of time and the determined actual value of the capacitor.

3. A method to operate a mobile station, comprising:
   measuring an actual value of at least one filter component value; and
   determining at least one downstream adaptive filter coefficient using the measured actual value so as to compensate the mobile station for a deviation of at least one filter component value from an ideal value,
   where the filter comprises an RC network, where measuring is used to determine a value of parameters $k_R$ and $k_C$, and further comprising calculating the actual value of a resistor ($R_{act}$) and a capacitor ($C_{act}$) using $k_R$ and $k_C$, respectively.

4. A method to operate a mobile station, comprising:
   measuring an actual value of the at least one filter component value; and determining at least one downstream adaptive filter coefficient using the measured actual value so as to compensate the mobile station for a deviation of at least one filter component value from an ideal value, where the at least one filter coefficient is obtained from an s-domain transfer function by performing a z-transformation.

5. A method as in claim 4, where the z-transformation employs a bilinear transformation comprising normalizing a pre-emphasis function, and substituting for s using a z transformation operation that includes using a prewarping factor, having a value that is a function of digital sample time, so as to compensate for the nonlinear z-transformation.

6. Apparatus for operating with an RC filter comprising components integrated upon an integrated circuit, comprising:

circuitry, included as a part of said integrated circuit, for use in measuring an actual value of at least one filter component; and a controller, coupled to said measurement circuitry, for determining at least one adaptive filter coefficient using the measured actual value so as to compensate for a deviation of at least one filter component value from an ideal value, where the filter comprises an RC network, and where said circuitry measures an actual value of a capacitor, and said controller then uses the measured actual value of the capacitor when determining the value of a resistor.

7. Apparatus for operating with an RC filter comprising components integrated upon an integrated circuit, comprising:

circuitry, included as a part of said integrated circuit, for use in measuring an actual value of at least one filter component; and a controller, coupled to said circuitry, for determining at least one adaptive filter coefficient using the measured actual value so as to compensate for a deviation of at least one filter component value from an ideal value, where the filter comprises an RC network, and where said circuitry comprises:

means for determining a first amount of time required to charge a capacitor from a constant current source from an initial voltage to a threshold voltage, and where said controller determines the actual value of the capacitor using the first amount of time; and means for determining a second amount of time required to charge the capacitor from the initial voltage to the threshold voltage using a predetermined voltage applied through a resistor; and where said controller determines the actual value of the resistor using the second amount of time and the determined actual value of the capacitor.

* * * * *